United States Patent [19]
Singh et al.

[11] Patent Number: 5,853,963
[45] Date of Patent: Dec. 29, 1998

[54] LIFE EXTENSION OF PHOTORESIST DEVELOPER SOLUTIONS

[75] Inventors: Rajwant Singh, Brea; Gerald A. Krulik, San Clemente, both of Calif.

[73] Assignee: Applied Chemical Technologies, Inc., Santa Ana, Calif.

[21] Appl. No.: 909,168

[22] Filed: Aug. 11, 1997

[51] Int. Cl.$^6$ ....................................................... G03C 5/31
[52] U.S. Cl. ............................................ 430/399; 430/398
[58] Field of Search ..................................... 430/331, 398, 430/399

[56] References Cited

U.S. PATENT DOCUMENTS

| | | | |
|---|---|---|---|
| 3,832,453 | 8/1974 | Slovonsky et al. | 430/400 |
| 5,217,848 | 6/1993 | Uehara et al. | 430/331 |
| 5,234,796 | 8/1993 | Shimura et al. | 430/331 |
| 5,541,027 | 7/1996 | Wuelfing, Jr. | 430/399 |
| 5,695,903 | 12/1997 | Elsaeher et al. | 430/331 |

*Primary Examiner*—Hoa Van Le

[57] ABSTRACT

This invention relates to a method for increasing the effective process life and chemical efficiency of use of aqueous-based developer solutions used for chemical development of photoresists such as are used in the printed circuit industry. The activity is maintained by regenerating some of byproducts during the process to active carbonate, by controlled additions of alkaline hydroxide instead if conventional carbonate solution. The pH and thus the development speed can automatically be controlled at any desired constant value. This invention allows simple automation of printed circuit photoresist development, with reduced chemical costs and increased chemical usage efficiency and thus reducing the industrial waste volume.

6 Claims, No Drawings

LIFE EXTENSION OF PHOTORESIST DEVELOPER SOLUTIONS

BACKGROUND OF THE INVENTION

1. Field of the Invention

This invention relates to the processing of dry film and liquid based photoresists, especially for the printed circuit industry. It comprises a method to extend the effective operating life of photoresist development solutions with consequent minimization of waste disposal, savings in raw materials, and process down time. It also offers improved control of process parameters such as constant development speed and pH maintenance. 2. Background and Prior Art A typical printed circuit board uses a copper conductor attached to an insulating support, in a patterned manner. An organic photoresist is applied onto the copper conductor. This photoresist may be of negative or positive acting type, and may be a dry film photoresist or a liquid formulation photoresist. The photoresist may be applied by any standard process, including curtain coating, cold or hot lamination, spin coating, roller coating, and so forth, onto the copper conductor. After curing (if necessary) of the applied photoresist, the printed circuit board is exposed to a source of imaging radiation to differentiate between the image and non-image areas. The unwanted photoresist must now be removed to allow further processing. Normally the exposed areas of photoresist are cross-linked by the radiation source. This hardens the photoresist and makes it insoluble. The unexposed photoresist is not cross-linked and is soluble in dilute alkaline solutions.

The process for removal of the unexposed photoresist is called photoresist development. Earlier technology solvent developing photoresists and semi-aqueous developing photoresists are rarely used now except for special purposes. Those developers use a chlorinated solvent; or a mixture of water, an aqueous miscible solvent such as ethylene glycol monobutyl ether, and other chemicals, respectively.

The chemical developer for aqueous developable photoresists is typically an alkaline solution based on potassium, sodium, or ammonium carbonates. This reacts with one or more components of the photoresist to form soluble derivatives. The normal effective pH range of this solution is about 11.5 to 10.2. Too high a pH leads to bulk stripping of the photoresist, whereas too low a pH is ineffective. Typical operating temperature is about 27°–32° C. (80°–90° F.) Typical concentration is about 1% measured as pure carbonate, with a range of about 0.75–1.5%. Development is normally done using a spray machine, with development times of about 30–120 seconds.

Many other compounds have been used as developers, as single component aqueous solutions, or as part of mixtures. These include silicates, phosphates, borates, hydroxides, and bicarbonates. Amine salts and salts of non-alkali metals have been used. The ionic strength of these solutions is typically low, due to the need to control the pH at a controlled level of about 10.2 to 11.5 (Opt. 10.2–11.2).

The operating life of these developer solutions is short due to the low ionic strength, which results in only a small amount of reactive ions, and the low buffering capability of the resultant solution. This means they rapidly change pH due to reaction with the photoresist and become ineffective. A typical printed circuit board with a negative type photoresist may have 40–60% of the photoresist in the cross-linked or insoluble state, leaving the remainder to be dissolved in the developer solution.

Developer solution tanks tend to be large due to the low effective life per unit volume, and to be dumped at regular intervals. They are often dumped every shift whether they are completely exhausted or not, in order to ensure uninterrupted production. No attempt is usually made to replenish the developer solutions when done in batch mode processing. Bath life is usually measured in terms of square feet of processed panels per gallon of solution. This ranges from about 12 to 18 mil-square feet of photoresist per gallon of developer. The short and rapidly changing developer bath life means that the developer speed, expressed in terms of conveyer speed in feet/minute or in terms of seconds needed for full development, must be constantly monitored and adjusted. This makes automation of the development process extremely difficult due to the constant need for operator evaluation and adjustment. This is extremely wasteful of labor and chemicals, as the bath must be dumped, a new bath carefully prepared, and the bath heated to operating temperature. The spent bath, if not waste treated due to lack of a specific hazard, contains large amounts of dissolved organic materials. Because the developer solutions are not replenished to their original state, the activity decreases steadily with time. The developing speed can vary, for example, from 6.8 Feet per minute (when solution is new, pH=11.2) to 5.2 feet per minute (when solution is exhausted, pH=10.5).

In feed & bleed method, it is common to use pH controllers on the bath, in an effort to maintain the activity of the developer. When the pH drops to the set point of about pH 10.75, concentrated carbonate developer solution pre-mixed with water to give about a 1% by weight carbonate solution having a pH of about 11.2–11.5, is added back to the developer working bath to maintain the pH at about 10.75, plus or minus 0.05 pH. This is inefficient, as the carbonate becomes converted to bicarbonate ions during use due to absorption of carbon dioxide from the air. Hydroxide is also consumed by reaction with carboxylate groups found in the photoresist, during the conversion to soluble potassium salts. Bicarbonate ions buffer at a low pH below pH 7, whereas carbonate ions buffers at a high pH. Addition of more carbonate rapidly leads to production of more ineffective bicarbonate. The amounts of diluted carbonate solution added back are very high, and the excess solution volume is allowed to flow to the sewer. Often as much as half of the original solution volume must be thrown away, even though it is possible to use it for development down to about pH 10.5.

The pH set point can be varied, but this does not produce a cost-effective savings. If the pH set point is maintained at a higher pH, a higher percentage of raw material must be discarded to maintain the higher pH and the consequent rapid development rate. If the pH set point is maintained at a lower pH, a smaller percentage of raw material is discarded, but fewer printed circuit board panels can be processed per unit time as the development rate is slower. In both cases the chemical consumption is more than the batch mode method to process the same number of similar panels.

The following summary may help to distinguish existing and novel processes. Batch mode processing uses all the possible chemical, but the development rate requires constant adjustment as it slows. This method has much down time due to dumping, remaking, and re-heating a batch and also requires more manpower. Carbonate solution add-back (commonly referred to as feed & bleed method) during processing results in a high chemical consumption, as the efficiency of chemical use can be 25–50% lower than the batch method. The conveyor speed is constant only when the pH drops to and is maintained at about 10.75. There is a large volume of dilute waste, but the process gives continuous processing ability with low down time.

The present invention uses high pH, high intrinsic ionic strength additives to maintain a constant pH. The preferred additives are potassium hydroxide, sodium hydroxide, and ammonium hydroxide. The volume of alkaline additives is so small that it usually offsets evaporative and drag-out losses, so no process chemical solution need be dumped. This has by far the lowest chemical usage factor per mil-square foot of photoresist processed. The chemical use efficiency is independent of the pH set point, so near 100% efficiency is always attained. The actual pH set point can be maintained to give the optimum process speed with little or no operator involvement, thus allowing a large degree of automation with its resultant savings.

It is a principal object of the present invention to provide a new method for regeneration and control of aqueous developer solutions. This method reduces down time and manpower needs, gives a more stable process, increased productivity, and reduces waste disposal.

SUMMARY OF THE INVENTION

The present invention is directed to the regeneration and control of developer solutions suitable for aqueous developable photoresists. This invention comprises the following sequence of steps:

1. Monitoring of a property of the developer bath which can be related to developer speed. The most common parameter is pH set point control. Other methods can be used, including electrical conductivity, refractive index, and specific gravity, separately or in combination.
2. Addition of a non-carbonate based alkaline hydroxide solution to the used developer solution,
3. Conversion of inactive bicarbonates to active carbonates and/or a mixture with hydroxide ions,
4. Continued reuse of the regenerated developer solution.
5. Use of an optional second control point, to indicate when the process solution should be dumped or diluted due to accumulated dissolved photoresist. The method used for the second control point can include pH, operating time, or solution electrical conductivity, refractive index, specific gravity, or other parameter, separately or in combination.

This invention is applicable to any developer solution containing carbonates. Since all alkaline developer solutions work by controlled pH conversion of carboxylic acids to soluble salts, and all also absorb carbon dioxide from the air which reduces the desired pH, this invention is applicable to all standard photoresist developer solutions.

Photoresist development solutions must be finely balanced in order to maintain rapid dissolution of unexposed photoresist, yet not be sufficiently active to remove exposed photoresist. Exposed photoresist is often stripped from the printed circuit board by use of concentrated high pH hydroxide solutions, so there is the necessity to precisely control development without weakening or partially dissolving the exposed photoresist to cause stripping. This is especially critical when very thin lines with narrow line spacings are processed. Certain components of the photoresist are converted to soluble potassium, sodium, or ammonium salts, thus also removing associated chemical components in the photoresist film. It is not possible to prepare a concentrated solution with a long working life, due to the need to have precisely controlled pH. High ionic strength solutions can strip off both exposed and unexposed photoresist. Pure alkali solutions are not useful, as only very small amounts of potassium hydroxide, for example, are sufficient to make a pH 11 solution. This gives an extremely short working life. In practice, only fairly dilute buffered solutions such as carbonates give satisfactory, though still short, bath life.

The present invention recognizes that the majority of the chemicals in the developer solution have not been usefully reacted with the photoresist, but have reacted with other materials to become inactive. The most important of these other materials is carbon dioxide which is rapidly absorbed from the air. This converts the active carbonate to inactive bicarbonate.

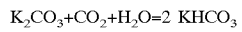

$$K_2CO_3 + CO_2 + H_2O = 2\ KHCO_3$$

The addition of a stronger base, preferably a strong base such as potassium or sodium hydroxide, reverses this reaction as follows:

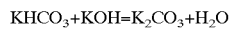

$$KHCO_3 + KOH = K_2CO_3 + H_2O$$

This increases the concentration of carbonate by use of a small amount of chemical. Any other chemical which produces large amounts of alkalinity could be used in place of alkali metal or ammonium hydroxides. Typical compounds are silicates such as metasilicate, phosphates, hydrogen phosphates, tetraborates, and their mixtures.

DESCRIPTION OF THE PREFERRED EMBODIMENTS

This set of data show the difference between the standard batch process method of photoresist development (Example I), the standard feed-and-bleed replenishment method (Example III), and the improved method described in this invention (Examples II, IV, V).

The control methods useful in the examples include any practical method of control to establish an endpoint which signals exhaustion of the process solution. Typically the pH and development time are used as the set point controls. Other methods used to establish a dump schedule or a feed and bleed schedule may include specific gravity, electrical conductivity, refractive index, and total organic carbon measurements.

EXAMPLE I

This Example illustrates a typical batch process method for photoresist development. A potassium carbonate developer solution was prepared at 10 g/l anhydrous potassium carbonate (1%). This took 3.2 gallons of 25% by weight potassium carbonate solution. The 380 liters (100 gallons) of solution was heated to about 32° C.(90° F.). Printed circuit board test panels were coated with Dupont Corporation (Wilmington, Del.) Riston 9115 aqueous developable dry film photoresist of 1.5 mil thickness. The initial pH was 11.2. This solution was used until the pH dropped to 10.5. During use, approximately 375 printed circuit board panels were processed. Each panel was 18×24 inches, coated on both sides with photoresist. About 50% of the total surface area of resist was removed during the development process. The printed circuit boards were processed on a standard horizontal conveyer spray-type machine. The operator had to keep decreasing the conveyor speed to keep the clean break point at 65–70% of the spray chamber length, to keep clean development with no resist lifting. When the developing time increased too much for practical use, the pH was about 10.5 and the solution was discarded. This represents the maximum number of panels which can be processed in the developer solution. This amount of photoresist amounts to 16–17 mil-square feet per gallon of working solution. To process another 375 panels, for a total of 750 panels, a second 100 gallon solution was necessary.

EXAMPLE II

The work in Example II shows the advantages of this invention over the process in Example I. The used potassium carbonate developer solution from Example I was regenerated by a single addition of only 1.3 liters of 45% by weight potassium hydroxide solution. No used developer solution had to be discarded due to the small volume of added potassium hydroxide. This was sufficient to increase the pH of the used developer solution to about 11.2. The regenerated developer solution was used in the same manner as in Example I. Approximately 375 additional 18×24 inch printed circuit board panels coated with 1.5 mils of photoresist were processed before the solution pH dropped to 10.5. This amount of photoresist amounts to about 32–35 mil square feet per gallon of working solution. There was no visible difference between the printed circuit board panels processed in the fresh developer solution of Example I and the regenerated developer solution of Example II, either visually or by scanning electron microscope.

EXAMPLE III

The work in Example I was repeated, using the continuous addition of dilute potassium carbonate solution, to illustrate another standard method of photoresist development. This method is commonly called feed-and-bleed. The feed adjustment setting was used to control the pH at about 10.75, once the original pH dropped from about 11.2 to 10.75. This time the mixture of potassium carbonate and water was added automatically to maintain the pH at about 10.75. This allowed the operator to maintain a continuous conveyor speed once the pH dropped from the initial pH 11.2 to the 10.75 pH addition set point. In this example, to process 750 panels (equivalent to two batches in example I), it took 3.2 gallons of 25% by weight of potassium carbonate solution for initial make-up and an additional 6–7 gallons of 25% by weight potassium carbonate solution mixed with water to make 200 gallons of 1% by weight potassium carbonate replenisher solution. Batch testing using spent developer solution from Example I showed that a single add of about 3.2 gallons of potassium carbonate per 100 gallons of solution would be sufficient to allow continued use of the developer solution. This shows that the efficiency of use of the carbonate solution is only about 60–70% when used in bleed & feed mode. A constant developing speed of 5.4 feet per minute was used at pH of 10.75.

EXAMPLE IV

The work in Example III was repeated to show the advantages of the described invention. This machine used 380 liters (100 gallons) of 10 grams per liter potassium carbonate solution at about pH 11.2 to start. The same type of photoresist panels were used as in Example I. Manual adds of 100 ml portions of 45% by weight potassium hydroxide were used each time the pH decreased to pH 10.9, instead of a dilute mixture of water and concentrated potassium carbonate solution. This potassium hydroxide solution was so concentrated that only about 100 ml was necessary to increase the pH from 10.9 back to 11.0 pH, so solution loss by overflow was eliminated. The narrow controlled pH range of the developer solution allowed continuous processing of photoresist coated panels with no conveyor speed adjustment. This property makes this method suitable for use in an automated machine, as continuous development speed adjustment by an operator is no longer necessary. The higher pH set point also allows more panels to be processed in any given time, as the development speed is faster. The above system was used for 24 hours with development speed of 6.2 feet per minute.

EXAMPLE V

The work in Example IV was repeated to further show the advantages of the described invention. An automatic control was used to continuously add potassium hydroxide solution, as needed. The pH controller was set to replenish at pH 10.95. The machine added a pure solution of 20% potassium hydroxide to control the pH between 10.95–11.05. All panels developed satisfactorily with continuous replenishment and constant speed of 6.4 feet per minute for over 24 hours. No time was lost in dumping, making up, and re-heating new solution so the economic benefit was significant, in addition to the savings in chemical usage and waste disposal.

The above examples show the use of aqueous potassium hydroxide solution to maintain pH and process activity. Solid, gaseous, and liquid forms of chemicals can be used to maintain pH. Although potassium hydroxide was used in the illustrative examples, sodium hydroxide, and ammonium hydroxide may also be useful. Other compatible non-carbonate, highly alkaline chemicals could be used for pH replenishment but are less satisfactory in terms of relative cost and efficiency. Such other chemicals include amines and sodium, potassium, ammonium, amine, and tetramethylammonium salts of phosphates, silicates, borates, and their mixtures. All data are summarized in the following Table I.

TABLE I

SUMMARY OF EXAMPLES I–V

| METHOD | CONVEYOR SPEED, FEET PER MINUTE | pH | CHEMICAL USE EFFICIENCY | CHEMICAL CONSUMPTION, 750 PCB PANELS, 18 × 24 IN. | | |
|---|---|---|---|---|---|---|
| | | | | 25% $K_2CO_3$ MAKEUP | REPLENISHMENT | VOLUME, GALLONS |
| BATCH EXAMPLE I | VARIABLE, 6.8–5.2 | VARIABLE, 11.2–10.5 | 100% | 6.4 $GAL^A$ | NONE | 200 |
| FEED & BLEED EXAMPLE III | CONSTANT 5.4 | CONSTANT 10.75 ± 0.05 AFTER INITIAL pH DROP | 50–75% | 3.2 GAL | 200 GAL 1% $K_2CO_3$ | 300 |

TABLE I-continued

SUMMARY OF EXAMPLES I–V

| METHOD | CONVEYOR SPEED, FEET PER MINUTE | pH | CHEMICAL USE EFFICIENCY | CHEMICAL CONSUMPTION, 750 PCB PANELS, 18 × 24 IN. | | |
|---|---|---|---|---|---|---|
| | | | | 25% K2CO3 MAKEUP | REPLENISHMENT | VOLUME, GALLONS |
| NOVEL BATCH EXAMPLE II | VARIABLE, 6.8–5.2 | VARIABLE, 11.2–10.5 | 100% | 3.2 GAL | 1.3 LITERS 45% KOH | 100[B] |
| NOVEL MANUAL ADD EXAMPLE IV | CONSTANT, 6.2 | 10.95 ± 0.05 CONSTANT | 100% | 3.2 GAL | 1.3 LITERS 45% KOH | 100[B] |
| NOVEL AUTOMATIC FEED EXAMPLE V | CONSTANT, 6.4 | 11.0 ± 0.05 CONSTANT | 100% | 3.2 GAL | 3.6 LITERS 20% KOH | 100[B] |

A = Two 100 gallon batches needed; all others 100 gallons
B = This is the maximum solution volume used for comparison; minimum solution volume to process this number of panels can be much less, in which case potassium carbonate use would decrease and potassium hydroxide use would increase by a smaller amount.

We claim:

1. A method for maintaining the activity of aqueous carbonate based photoresist developer solutions for use in printed circuit boards manufacturing, by controlled additions of aqueous hydroxide or hydroxide plus carbonate solutions, to maintain a given pH or pH range.

2. A method as defined in claim 1 wherein said aqueous hydroxide solutions consist of sodium hydroxide or potassium hydroxide.

3. A method as defined in claim 1 wherein said controlled additions are done continuously.

4. A method as defined in claim 1 wherein said controlled additions are done periodically.

5. A method as defined in claim 1 wherein said controlled additions are used in an automated photoresist development machine.

6. A method as defined in claim 1 wherein the effective life of said photoresist developer solutions, is measured by changes in pH, electrical conductivity, specific gravity, total organic carbon content, or refractive index.

* * * * *